United States Patent
Henri et al.

(10) Patent No.: US 9,564,312 B2
(45) Date of Patent: Feb. 7, 2017

(54) SELECTIVE INHIBITION IN ATOMIC LAYER DEPOSITION OF SILICON-CONTAINING FILMS

(71) Applicant: Lam Research Corporation, Fremont, CA (US)

(72) Inventors: Jon Henri, West Linn, OR (US); Dennis M. Hausmann, Lake Oswego, OR (US); Bart J. van Schravendijk, Palo Alto, CA (US); Shane Tang, West Linn, OR (US); Karl F. Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/552,011

(22) Filed: Nov. 24, 2014

(65) Prior Publication Data
US 2016/0148800 A1    May 26, 2016

(51) Int. Cl.
| | |
|---|---|
| H01L 21/02 | (2006.01) |
| C23C 16/455 | (2006.01) |
| C23C 16/52 | (2006.01) |
| C23C 16/50 | (2006.01) |

(52) U.S. Cl.
CPC ..... *H01L 21/0228* (2013.01); *C23C 16/45544* (2013.01); *C23C 16/50* (2013.01); *C23C 16/52* (2013.01); *H01L 21/0217* (2013.01); *H01L 21/02164* (2013.01); *H01L 21/02312* (2013.01); *H01L 21/02592* (2013.01);
(Continued)

(58) Field of Classification Search
CPC ............. H01L 21/02365; H01L 21/02518; H01L 21/285; H01L 21/70; H01L 21/702; H01L 21/71
See application file for complete search history.

(56) References Cited

U.S. PATENT DOCUMENTS

| | | |
|---|---|---|
| 4,158,717 A | 6/1979 | Nelson |
| 4,500,563 A | 2/1985 | Ellenberger et al. |
| 4,575,921 A | 3/1986 | Bhagat |

(Continued)

FOREIGN PATENT DOCUMENTS

| | | |
|---|---|---|
| CN | 1732288 A | 2/2006 |
| CN | 1926668 A | 3/2007 |

(Continued)

OTHER PUBLICATIONS

U.S. Appl. No. 14/335,785, filed Jul. 18, 2014, entitled "Methods for Depositing Silicon Oxide."

(Continued)

*Primary Examiner* — Cheung Lee
(74) *Attorney, Agent, or Firm* — Weaver Austin Villeneuve & Sampson LLP

(57) ABSTRACT

Methods of selectively inhibiting deposition of silicon-containing films deposited by atomic layer deposition are provided. Selective inhibition involves exposure of an adsorbed layer of a silicon-containing precursor to a hydrogen-containing inhibitor, and in some instances, prior to exposure of the adsorbed layer to a second reactant. Exposure to a hydrogen-containing inhibitor may be performed with a plasma, and methods are suitable for selective inhibition in thermal or plasma enhanced atomic layer deposition of silicon-containing films.

14 Claims, 6 Drawing Sheets

(52) U.S. Cl.
CPC .... *H01L 21/02595* (2013.01); *H01L 21/0262* (2013.01); *H01L 21/02532* (2013.01)

(56) References Cited

U.S. PATENT DOCUMENTS

| | | |
|---|---|---|
| 4,869,781 A | 9/1989 | Euen et al. |
| 5,091,332 A | 2/1992 | Bohr et al. |
| 5,223,443 A | 6/1993 | Chinn et al. |
| 5,230,929 A | 7/1993 | Caporiccio et al. |
| 5,496,608 A | 3/1996 | Matsuda et al. |
| 5,593,914 A | 1/1997 | Evans, Jr. et al. |
| 5,670,432 A | 9/1997 | Tsai |
| 5,731,235 A | 3/1998 | Srinivasan et al. |
| 5,856,003 A | 1/1999 | Chiu |
| 5,874,368 A | 2/1999 | Laxman et al. |
| 5,932,286 A | 8/1999 | Beinglass et al. |
| 6,153,519 A | 11/2000 | Jain et al. |
| 6,197,701 B1 | 3/2001 | Shue et al. |
| 6,218,293 B1 | 4/2001 | Kraus et al. |
| 6,228,779 B1 | 5/2001 | Bloom et al. |
| 6,270,572 B1 | 8/2001 | Kim et al. |
| 6,346,741 B1 | 2/2002 | Van Buskirk et al. |
| 6,380,056 B1 | 4/2002 | Shue et al. |
| 6,391,803 B1 | 5/2002 | Kim et al. |
| 6,395,652 B2 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,518,167 B1 | 2/2003 | You et al. |
| 6,528,430 B2 | 3/2003 | Kwan et al. |
| 6,534,395 B2 | 3/2003 | Werkhoven et al. |
| 6,548,368 B1 | 4/2003 | Narwankar et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,638,879 B2 | 10/2003 | Hsieh et al. |
| 6,645,574 B1 | 11/2003 | Lee et al. |
| 6,689,220 B1 | 2/2004 | Nguyen |
| 6,709,928 B1 | 3/2004 | Jenne et al. |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,794,284 B2 | 9/2004 | Vaartstra |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,933,245 B2 | 8/2005 | Lee et al. |
| 6,943,092 B2 | 9/2005 | Kim et al. |
| 6,962,876 B2 | 11/2005 | Ahn et al. |
| 6,967,159 B2 | 11/2005 | Vaartstra |
| 6,987,240 B2 | 1/2006 | Jennings et al. |
| 7,001,844 B2 | 2/2006 | Chakravarti et al. |
| 7,019,159 B2 | 3/2006 | Dussarrat et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaartstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,465,669 B2 | 12/2008 | Iyer et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,514,366 B2 | 4/2009 | Trivedi et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,939,455 B2 | 5/2011 | Clark |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |

(56) References Cited

U.S. PATENT DOCUMENTS

| | | |
|---|---|---|
| 8,298,628 B2 | 10/2012 | Yang et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,956,983 B2 | 2/2015 | Swaminathan et al. |
| 8,999,859 B2 | 4/2015 | Swaminathan et al. |
| 9,070,555 B2 | 6/2015 | Hausmann et al. |
| 9,076,646 B2 | 7/2015 | Sims et al. |
| 9,214,333 B1 | 12/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0143841 A1 | 7/2003 | Yang et al. |
| 2003/0200917 A1 | 10/2003 | Vaartstra |
| 2004/0033698 A1 | 2/2004 | Lee et al. |
| 2004/0043570 A1 | 3/2004 | Fujisaki et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0219746 A1 | 11/2004 | Vaartstra et al. |
| 2004/0231799 A1 | 11/2004 | Lee et al. |
| 2005/0025885 A1 | 2/2005 | McSwiney et al. |
| 2005/0042865 A1 | 2/2005 | Cabral et al. |
| 2005/0079661 A1 | 4/2005 | Cho et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0227017 A1 | 10/2005 | Senzaki et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287309 A1 | 12/2005 | Veerasamy |
| 2005/0287775 A1 | 12/2005 | Hasebe et al. |
| 2006/0008656 A1 | 1/2006 | Veerasamy |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0065576 A1 | 3/2007 | Singh et al. |
| 2007/0087581 A1 | 4/2007 | Singh et al. |
| 2007/0134942 A1 | 6/2007 | Ahn et al. |
| 2007/0137572 A1 | 6/2007 | Matsuura et al. |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros-Jean et al. |
| 2007/0259110 A1 | 11/2007 | Mahajani et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0087890 A1 | 4/2008 | Ahn et al. |
| 2008/0119057 A1 | 5/2008 | Chua et al. |
| 2008/0123394 A1 | 5/2008 | Lee et al. |
| 2008/0124946 A1 | 5/2008 | Xiao et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2008/0318443 A1 | 12/2008 | Kim et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0167555 A1 | 7/2010 | Maula et al. |
| 2010/0221925 A1 | 9/2010 | Lee et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0003477 A1 | 1/2011 | Park et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0064969 A1 | 3/2011 | Chen et al. |
| 2011/0086516 A1 | 4/2011 | Lee et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |

(56) References Cited

U.S. PATENT DOCUMENTS

| | | |
|---|---|---|
| 2012/0104347 A1 | 5/2012 | Quick |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0177841 A1 | 7/2012 | Thompson |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0344248 A1* | 12/2013 | Clark ............... C23C 16/34 427/255.393 |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0193983 A1 | 7/2014 | LaVoie |
| 2014/0209562 A1 | 7/2014 | LaVoie et al. |
| 2014/0216337 A1 | 8/2014 | Swaminathan et al. |
| 2014/0264555 A1 | 9/2014 | Ahn et al. |
| 2014/0273428 A1 | 9/2014 | Shero et al. |
| 2014/0273477 A1 | 9/2014 | Niskanen et al. |
| 2014/0273528 A1 | 9/2014 | Niskanen et al. |
| 2014/0295084 A1 | 10/2014 | Shirai et al. |
| 2014/0302686 A1 | 10/2014 | Pan et al. |
| 2015/0031218 A1 | 1/2015 | Karakawa |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243708 A1 | 8/2015 | Ravasio et al. |
| 2015/0243883 A1 | 8/2015 | Swaminathan et al. |
| 2015/0247238 A1 | 9/2015 | Pasquale et al. |
| 2015/0249013 A1 | 9/2015 | Arghavani et al. |
| 2015/0259791 A1 | 9/2015 | Hausmann et al. |
| 2016/0020092 A1 | 1/2016 | Kang et al. |
| 2016/0046501 A1 | 2/2016 | Kverel et al. |
| 2016/0064211 A1 | 3/2016 | Swaminathan et al. |
| 2016/0093484 A1 | 3/2016 | Marsh |
| 2016/0118246 A1 | 4/2016 | Kang et al. |
| 2016/0148806 A1 | 5/2016 | Henri et al. |
| 2016/0163539 A9 | 6/2016 | Kang et al. |
| 2016/0163972 A1 | 6/2016 | Swaminathan et al. |

FOREIGN PATENT DOCUMENTS

| | | |
|---|---|---|
| CN | 101255548 A | 9/2008 |
| CN | 101378007 A | 3/2009 |
| CN | 101416293 A | 4/2009 |
| CN | 101535524 A | 9/2009 |
| CN | 101889331 A | 11/2010 |
| CN | 103137864 A | 6/2013 |
| EP | 0 277 766 | 8/1988 |
| EP | 0 541 212 | 5/1993 |
| EP | 1 703 552 A2 | 9/2006 |
| EP | 2 278 046 | 1/2011 |
| JP | 4364320 | 8/2009 |
| JP | 2010-10497 | 1/2010 |
| JP | 2013166965 A | 8/2013 |
| JP | 2013225655 A | 10/2013 |
| KR | 10-2001-0111448 | 12/2001 |
| KR | 10-2004-0001036 | 1/2004 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| TW | 201009942 A | 3/2010 |
| TW | 201042706 A1 | 12/2010 |
| WO | WO 2004/032196 | 4/2004 |
| WO | WO 2006/026350 | 3/2006 |
| WO | WO 2006/104741 | 10/2006 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

U.S. Appl. No. 14/494,914, filed Sep. 24, 2014, entitled "Methods and Apparatuses for Uniform Reduction of the In-Feature Wet Etch Rate of a Silicon Nitride Film Formed by ALD."

U.S. Appl. No. 14/552,245, filed Nov. 24, 2014, entitled "Method of Depositing Ammonia Free and Chlorine Free Conformal Film."

U.S. Appl. No. 14/678,736, filed Apr. 3, 2015, entitled "Deposition of Conformal Films by Atomic Layer Deposition and Atomic Layer Etch."

U.S. Appl. No. 14/935,317, filed Nov. 6, 2015, entitled "Method for Encapsulating a Chalcogenide Material."

US Office Action dated Mar. 15, 2013 issued in U.S. Appl. No. 13/084,399.

US Final Office Action dated Sep. 13, 2013 issued in U.S. Appl. No. 13/084,399.

US Notice of Allowance dated Jan. 15, 2014 issued in U.S. Appl. No. 13/084,399.

US Office Action dated Jan. 2, 2015 issued in U.S. Appl. No. 14/231,554.

US Final Office Action dated Jun. 10, 2015 issued in U.S. Appl. No. 14/231,554.

US Notice of Allowance dated Aug. 31, 2015 issued in U.S. Appl. No. 14/231,554.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

US Office Action dated Aug. 1, 2012 issued in U.S. Appl. No. 13/011,569.

US Final Office Action dated Feb. 26, 2013 issued in U.S. Appl. No. 13/011,569.

US Notice of Allowance dated May 6, 2013 issued in U.S. Appl. No. 13/011,569.

US Office Action dated Apr. 4, 2013 issued U.S. Appl. No. 13/242,084.

US Notice of Allowance dated Jun. 19, 2013 issued U.S. Appl. No. 13/242,084.

US Notice of Allowance dated Sep. 19, 2013 issued U.S. Appl. No. 13/242,084.

US Office Action dated Sep. 21, 2015 issued U.S. Appl. No. 14/607,997.

(56) References Cited

OTHER PUBLICATIONS

US Notice of Allowance dated Aug. 7, 2014 issued U.S. Appl. No. 14/133,239.
US Notice of Allowance dated Nov. 26, 2014 issued U.S. Appl. No. 14/133,239.
US Office Action dated Apr. 29, 2013 issued U.S. Appl. No. 13/224,240.
US Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
US Office Action dated Jun. 7, 2013 issued U.S. Appl. No. 13/414,619.
US Notice of Allowance dated Jul. 26, 2013, issued U.S. Appl. No. 13/414,619.
US Office Action dated Apr. 11, 2014 issued in U.S. Appl. No. 14/065,334.
US Final Office Action dated Nov. 14, 2014 issued in U.S. Appl. No. 14/065,334.
US Notice of Allowance dated Feb. 17, 2015 issued in U.S. Appl. No. 14/065,334.
US Office Action dated May 24, 2013 issued U.S. Appl. No. 13/472,282.
US Notice of Allowance dated Oct. 4, 2013 issued U.S. Appl. No. 13/472,282.
US Office Action dated May 21, 2014 issued U.S. Appl. No. 13/607,386.
US Notice of Allowance dated Oct. 8, 2014 issued in U.S. Appl. No. 13/607,386.
US Notice of Allowance dated Nov. 19, 2014 issued in U.S. Appl. No. 13/607,386.
US Office Action dated Jun. 13, 2014 issued in U.S. Appl. No. 13/953,616.
US Final Office Action dated Nov. 24, 2014 issued in U.S. Appl. No. 13/953,616.
US Office Action dated Dec. 11, 2014 issued in U.S. Appl. No. 14/074,596.
US Office Action dated May 15, 2015 issued in U.S. Appl. No. 14/074,617.
US Office Action dated Aug. 14, 2015 issued in U.S. Appl. No. 14/061,587.
US Office Action dated Mar. 2, 2015 issued in U.S. Appl. No. 14/137,860.
US Notice of Allowance dated Oct. 1, 2015 issued in U.S. Appl. No. 14/137,860.
US Notice of Allowance [Supplemental Notice of Allowability] dated Oct. 22, 2015 issued in U.S. Appl. No. 14/137,860.
US Office Action dated Jul. 10, 2014 issued in U.S. Appl. No. 14/144,107.
US Final Office Action dated Jan. 15, 2015 issued in U.S. Appl. No. 14/144,107.
US Notice of Allowance dated Mar. 19, 2015 issued in U.S. Appl. No. 14/144,107.
US Office Action dated Oct. 21, 2015 issued in U.S. Appl. No. 14/194,549.
US Notice of Allowance dated Aug. 5, 2015 issued in U.S. Appl. No. 14/183,287.
US Office Action dated Jul. 2, 2015 issued in U.S. Appl. No. 14/187,145.
US Office Action dated Apr. 13, 2015 issued in U.S. Appl. No. 14/335,785.
US Notice of Allowance dated Aug. 18, 2015 issued in U.S. Appl. No. 14/494,914.
US Office Action dated Oct. 1, 2015 issued in U.S. Appl. No. 14/552,245.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in CN 201180045808.6.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action [no translation] dated Nov. 6, 2015 issued in CN 201280053888.4.
European Extended Search Report dated Apr. 14, 2014 issued in EP 13 15 2046.
Korean Notice of Provisional Rejection dated Dec. 6, 2013 issued in KR 10-2012-0043797.
Korean Final Office Action dated Aug. 18, 2014 issued in KR 10-2012-0043797.
Korean Decision from the Patent Tribunal of the KIPO [description] dated May 26, 2015 issued in KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Cecchi et al., (2007) "Ultra-thin conformal pore-sealing of low-k materials by plasma-assisted ALD," *University of New Mexico, Albuquerque, NM, Sandia National Labs, Albuquerque, NM*, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Hausmann et al. (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$-Ar-$H_2$ plasma treatment for capacitor electrodes," *Materials Letters*, 59:615-617.

(56) References Cited

OTHER PUBLICATIONS

Li, Xingcun, et al., (2011) "Atomic Layer Deposition $Al_2O_3$ Thin Films in Magnetized Radio Frequency Plasma Source," *Physics Procedia* 18:100-106.
Lin et al., (1998) "Silicon Nitride Films Deposited by Atmospheric Pressure Chemical Vapor Deposition," *Materials Research Society Symposium Proceedings vol. 495, Chemical Aspects of Electronic Ceramics Processing, Symposium* held Nov. 30-Dec. 4, 1997, Boston, Massachusetts, U.S.A., 8 pages.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.
"PlasmaPro™ NGP® 80 Range," *Oxford Instruments* (2010), 8 pages.
Puurunen, Riikka L. (2005) "Surface chemistry of atomic layer deposition: A case study for the trimethylaluminum/water process," *Journal of Applied Physics*, 97:121301-1-121301-52.
van der Straten et al. (2004) "Atomic layer deposition of tantalum nitride for ultrathin liner applications in advanced copper metallization schemes," *Journal of Materials Research*, 19(2):447-453.
U.S. Appl. No. 15/015,952, filed Feb. 4, 2016, entitled "Methods for Depositing Films on Sensitive Substrates".
U.S. Appl. No. 14/987,542, filed Jan. 4, 2016, entitled "Gapfill of Variable Aspect Ratio Features With a Composite PEALD and PECVD Method".
U.S. Appl. No. 14/932,869, filed Nov. 4, 2015, entitled "High Growth Rate Process for Conformal Aluminum Nitride."
U.S. Appl. No. 14/935,317, filed Nov. 6, 2015, entitled "Method for Encapsulating a Chalcogenide Material."
US Office Action dated Dec. 24, 2015 issued in U.S. Appl. No. 14/074,596.
US Notice of Allowance dated Nov. 20, 2015 issued in U.S. Appl. No. 14/074,617.
US Notice of Allowance dated Feb. 11, 2016 issued in U.S. Appl. No. 14/061,587.
US Final Office Action dated Dec. 16, 2015 issued in U.S. Appl. No. 14/187,145.
US Notice of Allowance dated Feb. 1, 2016 issued in U.S. Appl. No. 14/552,245.
Chinese First Office Action dated Nov. 19, 2015 issued in CN 201280046487.6.
Taiwan Notice of Allowance and Search Report dated Dec. 18, 2015 issued in TW 101134692.
Taiwan Office Action and Search Report dated Jan. 27, 2016 issued in TW 101134692.
U.S. Appl. No. 15/224,347, filed Jul. 29, 2016, entitled "Plasma Assisted Atomic Layer Deposition of Multi-Layer Films for Patterning Applications."
U.S. Appl. No. 15/178,474, filed Jun. 9, 2016, entitled "Plasma Assisted Atomic Layer Deposition Titanium Oxide for Patterning Applications."
U.S. Appl. No. 15/201,221, filed Jul. 1, 2016, entitled "Selective Atomic Layer Deposition With Post-Dose Treatment."
US Office Action dated Jul. 1, 2016 issued in U.S. Appl. No. 13/963,212.
US Final Office Action dated Mar. 18, 2016 issued U.S. Appl. No. 14/607,997.
US Notice of Allowance dated Jun. 16, 2016 issued U.S. Appl. No. 14/607,997.
US Patent Board Decision on Appeal Before the Patent Trial and Appeal Board (Examiner Affirmed) dated Aug. 11, 2016 issued U.S. Appl. No. 13/224,240.
US Notice of Allowance [Supplemental Notice of Allowability] dated Mar. 1, 2016 issued in U.S. Appl. No. 14/061,587.
US Office Action dated Aug. 1, 2016 issued in U.S. Appl. No. 14/932,869.
US Notice of Allowance dated Feb. 25, 2016 issued in U.S. Appl. No. 14/187,145.
US Office Action dated Jun. 14, 2016 issued in U.S. Appl. No. 15/019,904.
US Final Office Action dated Aug. 24, 2016 issued in U.S. Appl. No. 14/335,785.
US Office Action dated May 24, 2016 issued in U.S. Appl. No. 14/552,245.
US Notice of Allowance dated Jul. 15, 2016 issued in U.S. Appl. No. 14/678,736.
US Office Action dated Apr. 18, 2016 issued in U.S. Appl. No. 14/935,317.
Taiwan Office Action dated Apr. 27, 2016 issued in Application No. TW 100113041.
Chinese Second Office Action dated Feb. 2, 2016 issued in Application No. CN 201180045808.6.
Taiwan Office Action dated May 5, 2016 issued in TW 100134208.
Chinese Second Office Action dated Aug. 22, 2016 issued in Application No. CN 201280046487.6.
Chinese Second Office Action dated Aug. 16, 2016 issued in Application No. CN 201280053888.4.
Chinese First Office Action dated May 19, 2016 issued in CN 201310021460.8.
Chinese First Office Action dated Feb. 22, 2016 issued in Application No. CN 201380006994.1.
Taiwan Office Action and Search Report dated Jul. 20, 2016 issued in Application No. TW 102102879.
Chinese First Office Action dated Apr. 11, 2016 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.

\* cited by examiner

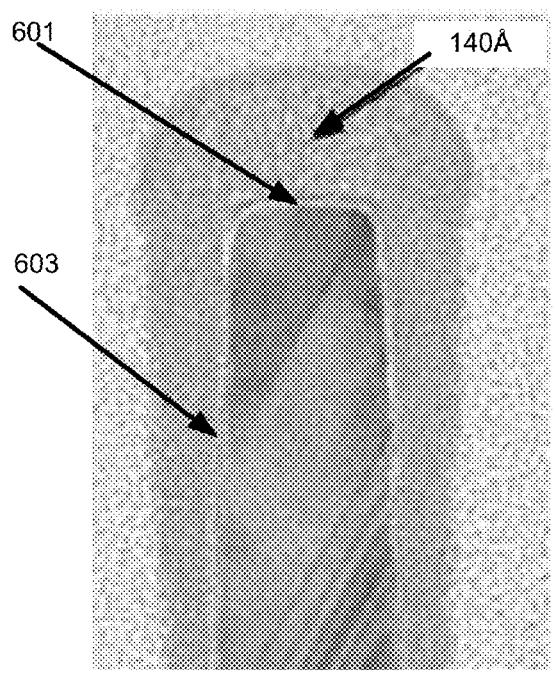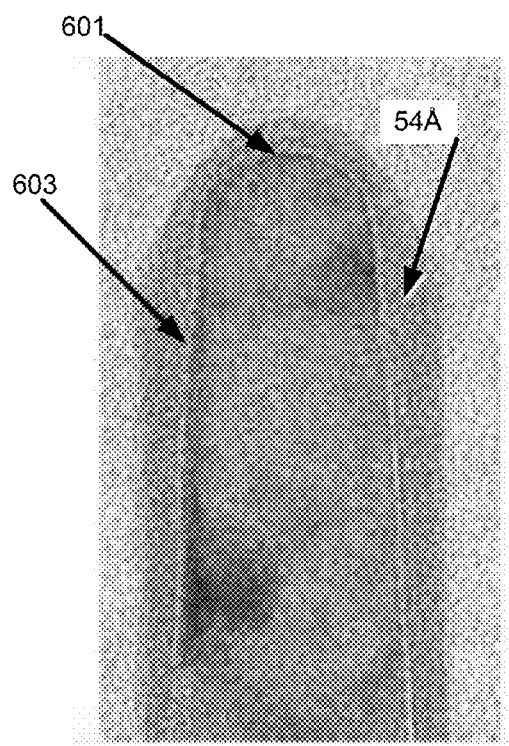
FIG. 6A   FIG. 6B

SELECTIVE INHIBITION IN ATOMIC LAYER DEPOSITION OF SILICON-CONTAINING FILMS

BACKGROUND

Silicon-containing films have various physical, chemical, and mechanical properties and are often used in semiconductor fabrication processes. For example, silicon nitride films may be used as diffusion barriers, gate insulators, sidewall spacers, and encapsulation layers, and silicon oxide may be used as dielectric films. In various applications, silicon-containing films are deposited by chemical vapor deposition (CVD) or by atomic layer deposition (ALD). However, some deposition of silicon-containing films may be nonconformal. As device dimensions continue to shrink, there is an increasing demand to tune a deposition profile for silicon-containing films.

SUMMARY

Provided herein are methods of depositing conformal silicon-containing films. One aspect involves a method of processing semiconductor substrates by exposing a substrate including a feature to a silicon-containing precursor to form an adsorbed layer; and exposing the adsorbed layer to a hydrogen-containing inhibitor to selectively inhibit deposition of a silicon-containing film on the substrate, whereby the silicon-containing precursor includes at least one Si—H bond.

In some embodiments, deposition is selectively inhibited at the top about 10% of the feature. In some embodiments, the hydrogen-containing inhibitor is selected from the group consisting of ammonia, hydrogen, and combinations thereof.

In various embodiments, the method further includes, after exposing the adsorbed layer to the hydrogen-containing inhibitor, exposing the substrate to a second reactant to form the silicon-containing film. In some embodiments, the second reactant is selected from the group consisting of nitrogen, nitrogen-containing gases, and oxygen-containing gases. In some embodiments, exposing the substrate to the second reactant further includes igniting a plasma.

In some embodiments, exposing the adsorbed layer to the hydrogen-containing inhibitor further includes igniting an in-situ plasma. In some embodiments, the silicon-containing film includes silicon oxide. In some embodiments, the method includes after exposing the adsorbed layer to the hydrogen-containing inhibitor, exposing the substrate to a second reactant to form the silicon-containing film, whereby the second reactant is an oxygen-containing reactant.

In various embodiments, the adsorbed layer includes dangling bonds, silicon-silicon dimers, and combinations thereof. The method may include purging a reaction chamber housing the substrate after exposing the substrate to the silicon-containing precursor.

In some embodiments, the silicon-containing film includes silicon nitride. In some embodiments, the silicon-containing film includes crystalline silicon, amorphous silicon, or polysilicon.

Another aspect involves a method of processing semiconductor substrates by exposing a substrate to a silicon-containing precursor to form an adsorbed layer; exposing the adsorbed layer to a hydrogen-containing compound; and after exposing the adsorbed layer to the hydrogen-containing compound, exposing the substrate to a second reactant to form a silicon-containing film on the substrate, such that the silicon-containing precursor includes at least one Si—H bond.

In some embodiments, exposing the adsorbed layer to the hydrogen-containing compound further includes igniting a plasma. In some embodiments, exposing the substrate to the second reactant further includes igniting a plasma. The hydrogen-containing compound may be selected from the group consisting of ammonia, hydrogen, and combinations thereof.

Another aspect of the subject matter disclosed herein involves a method including exposing a substrate having a feature thereon to an inhibitor such that the inhibitor is selectively adsorbed to sites at the top of the feature; and performing one or more deposition cycles to deposit material in the feature.

Another aspect of the subject matter disclosed herein may be implemented in method including performing a deposition cycle, the deposition cycling including operations of exposing a substrate having a feature thereon to an inhibitor such that the inhibitor is selectively adsorbed to sites at the top of the feature; optionally removing the inhibitor ambient; exposing the substrate to a first precursor; optionally removing the first precursor ambient; exposing the substrate to a second precursor; and optionally removing the second precursor ambient; and repeating the deposition cycle one or more times to deposit material in the feature.

Another aspect involves an apparatus for processing semiconductor substrates, the apparatus including: at least one process chamber including a pedestal for holding a substrate; at least one outlet for coupling to a vacuum; one or more process gas inlets coupled to one or more silicon-containing precursor sources; one or more process gas inlets coupled to one or more hydrogen-containing inhibitor sources; one or more process gas inlets coupled to one or more second reactant sources; and a controller for controlling operations in the apparatus. The controller may include machine readable instructions for performing any of the methods disclosed herein. In some embodiments, the controller includes machine readable instructions for: introducing the one or more silicon-containing precursors to the process chamber to form an adsorbed layer, introducing the one or more hydrogen-containing inhibitors to the process chamber to selectively inhibit deposition of a silicon-containing film; and introducing the one or more second reactants to the process chamber to form a silicon-containing film, such that the one or more silicon-containing precursor sources includes compounds with at least one Si—H bond.

In some embodiments, the machine-readable instructions for introducing the one or more hydrogen-containing inhibitors further include introducing the one or more hydrogen-containing inhibitors for a duration between about 0.05 second and about 60 seconds. In some embodiments, the one or more hydrogen-containing inhibitors are selected from the group consisting of ammonia, hydrogen, and combinations thereof.

In various embodiments, the apparatus also includes a plasma generator, whereby the controller further includes machine-readable instructions for igniting a plasma while introducing the one or more hydrogen-containing inhibitors. In some embodiments, the apparatus also includes a plasma generator, such that the controller further includes machine-readable instructions for igniting a plasma while introducing the one or more second reactants.

These and other aspects are described further below with reference to the drawings.

BRIEF DESCRIPTION OF THE DRAWINGS

FIG. 6A is an image of a silicon nitride film deposited on a substrate with features.

FIG. 6B is an image of a silicon nitride film deposited on a substrate with features in an experiment conducted in accordance with disclosed embodiments.

DETAILED DESCRIPTION

Figure 1:
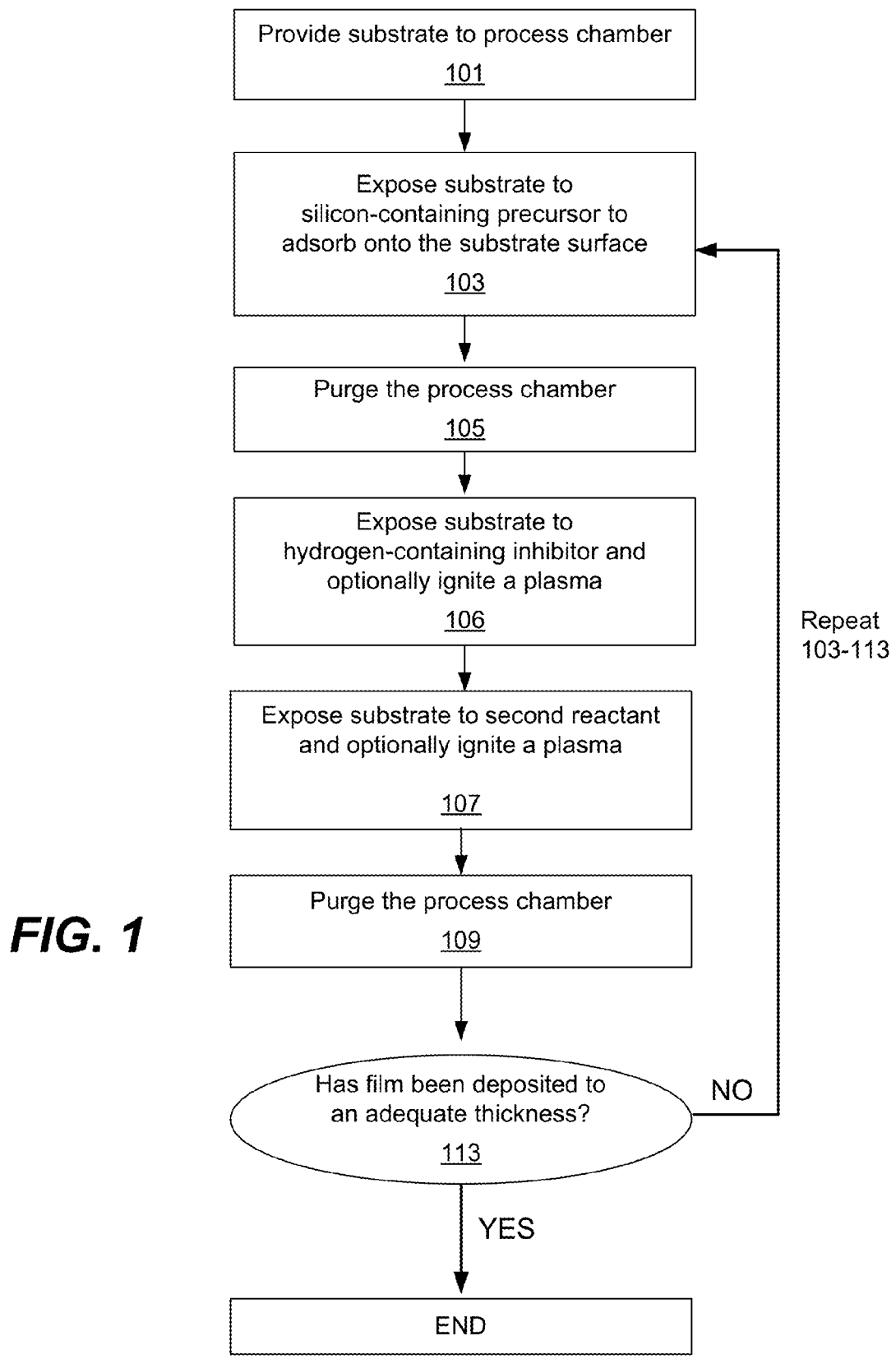
FIG. 1 is a process flow diagram depicting operations for a method in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Silicon-containing films play an important role in semiconductor device fabrication. For example, silicon nitride may be used as diffusion barriers, gate insulators, sidewall spacers, encapsulation layers, and etch stop layers, while silicon oxide may be used as a low-k dielectric film in a semiconductor device. Crystalline silicon, amorphous silicon, and polysilicon may also be deposited in various processes. In various applications, silicon-containing films are deposited conformally onto features of a substrate. Some conformal silicon-containing films may be deposited by atomic layer deposition (ALD). However, some deposition processes may still yield nonconformal deposition on a substrate with features.

Provided herein are methods of selectively inhibiting deposition of silicon-containing films. The methods include selective inhibition by exposing a substrate or features on a substrate to a hydrogen-containing inhibitor, which may be a hydrogen-containing gas with or without plasma. In particular, the selective inhibition exposure to a hydrogen-containing gas may be performed after a silicon-containing precursor is adsorbed on the surface of the substrate during an ALD deposition cycle. Selective inhibition using methods provided herein may be performed on adsorbed layers of a silicon-containing precursor used for depositing silicon-containing films. In various embodiments, the silicon-containing precursor includes at least one hydrogen atom, and a layer of adsorbed silicon-containing precursors on a substrate may include dangling bonds, silicon-silicon dimers, and/or other highly reactive structures.

Methods may be applicable to both thermal ALD and plasma-enhanced ALD (PEALD). The deposited films may be highly conformal. Conformality of films may be measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage. Films deposited using the ALD cycles and inhibition exposures described herein yield conformal silicon-containing films with good step coverage, such as at least about 80% for an aspect ratio of about 4:1, with about 50 Å film thickness. In some embodiments, selective inhibition is performed for ALD processes to yield conformal films.

The methods provided herein involve deposition by ALD. Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first reactant or precursor, such as a silicon-containing precursor, in a dose provided to a process station housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety. After a first precursor dose, the reactor is then evacuated to remove any first precursor remaining in gas phase so that only the adsorbed species remain. A second reactant, such as a nitrogen-containing reactant, is introduced to the reactor so that some of these molecules react with the first precursor adsorbed on the surface. In some processes, the second reactant reacts immediately with the adsorbed first precursor. In other embodiments, the second reactant reacts only after a source of activation is applied temporally. The reactor may then be evacuated again to remove unbound second reactant molecules. Additional ALD cycles may be used to build film thickness.

In some implementations, the ALD methods include plasma activation. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S.

patent application Ser. No. 13/084,305, filed Apr. 11, 2011, and titled "SILICON NITRIDE FILMS AND METHODS," which are herein incorporated by reference in its entireties.

Figure 2:
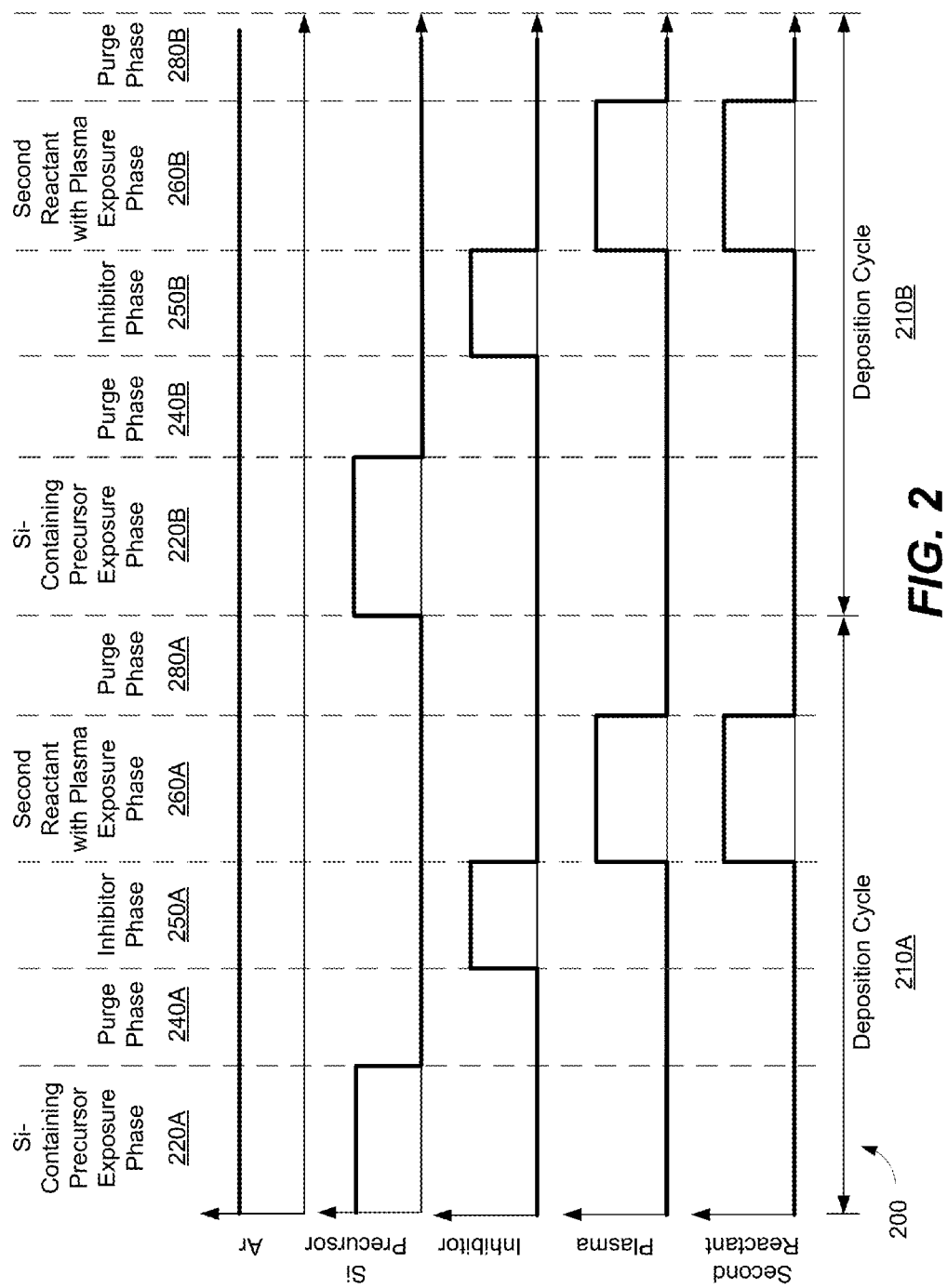
FIG. 2 is a timing sequence diagram showing an example of cycles in a method in accordance with disclosed embodiments.

FIG. 1 is an example of a process flow diagram depicting operations for performing methods in accordance with disclosed embodiments. FIG. 2 is a timing sequence diagram of example pulses in accordance with disclosed embodiments. FIG. 2 shows phases in an example ALD process 200, for various process parameters, such as carrier gas flow, silicon-containing precursor flow, plasma, inhibitor, and second reactant flow. In FIG. 2, argon is indicated as an example carrier gas. The lines indicate when the flow or plasma is turned on and off, accordingly. Example process parameters include, but are not limited to, flow rates for inert and reactant species, plasma power and frequency, substrate temperature, and process station pressure. Note that the durations of each phase in FIG. 2 may not be drawn to scale. FIGS. 1 and 2 will be described together below.

During operations 103-109 of FIG. 1, an inert gas may be flowed. In various embodiments, the inert gas is used as a carrier gas. Example carrier gases include argon (Ar), helium (He), and neon (Ne). The example sequence in FIG. 2 uses argon as an example carrier gas, which is continuously flowed during the entire process. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

In operation 101 of FIG. 1, a substrate is provided to a process station. In some embodiments, the station may be in a process chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature may have an aspect ratio of at least about 2:1, at least about 4:1, at least about 6:1, at least about 10:1, or higher. The feature may also have a dimension near the opening, e.g., an opening diameter or line width of between about 10 nm to 500 nm, for example between about 25 nm and about 300 nm. Disclosed methods may be performed on substrates with features having an opening less than about 150 nm. A feature via or trench may be referred to as an unfilled feature or a feature. A feature that may have a re-entrant profile that narrows from the bottom, closed end, or interior of the feature to the feature opening.

In operation 103 of FIG. 1, the substrate is exposed to a silicon-containing precursor that is adsorbed onto the substrate surface. This operation may be part of an ALD cycle. The concept of an ALD "cycle" is relevant to the discussion of various embodiments herein. Generally a cycle is the minimum set of operations used to perform a surface deposition reaction one time. The result of one cycle is the production of at least a partial silicon-containing film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. As an example, a cycle may include the following operations: (i) delivery/adsorption of a silicon-containing precursor, (ii) purging of silicon-containing precursor from the station, (iii) delivery of a second reactant and optional plasma, and (iv) purging of the second reactant and optional plasma from the station.

Returning to FIG. 1, during operation 103, the substrate is exposed to the silicon-containing precursor such that the silicon-containing precursor is adsorbed onto the substrate surface to form an adsorbed layer. Unlike a CVD or CVD-like process to form a silicon (Si) layer, the silicon-containing precursor does not decompose to form a silicon layer.

Figure 3:
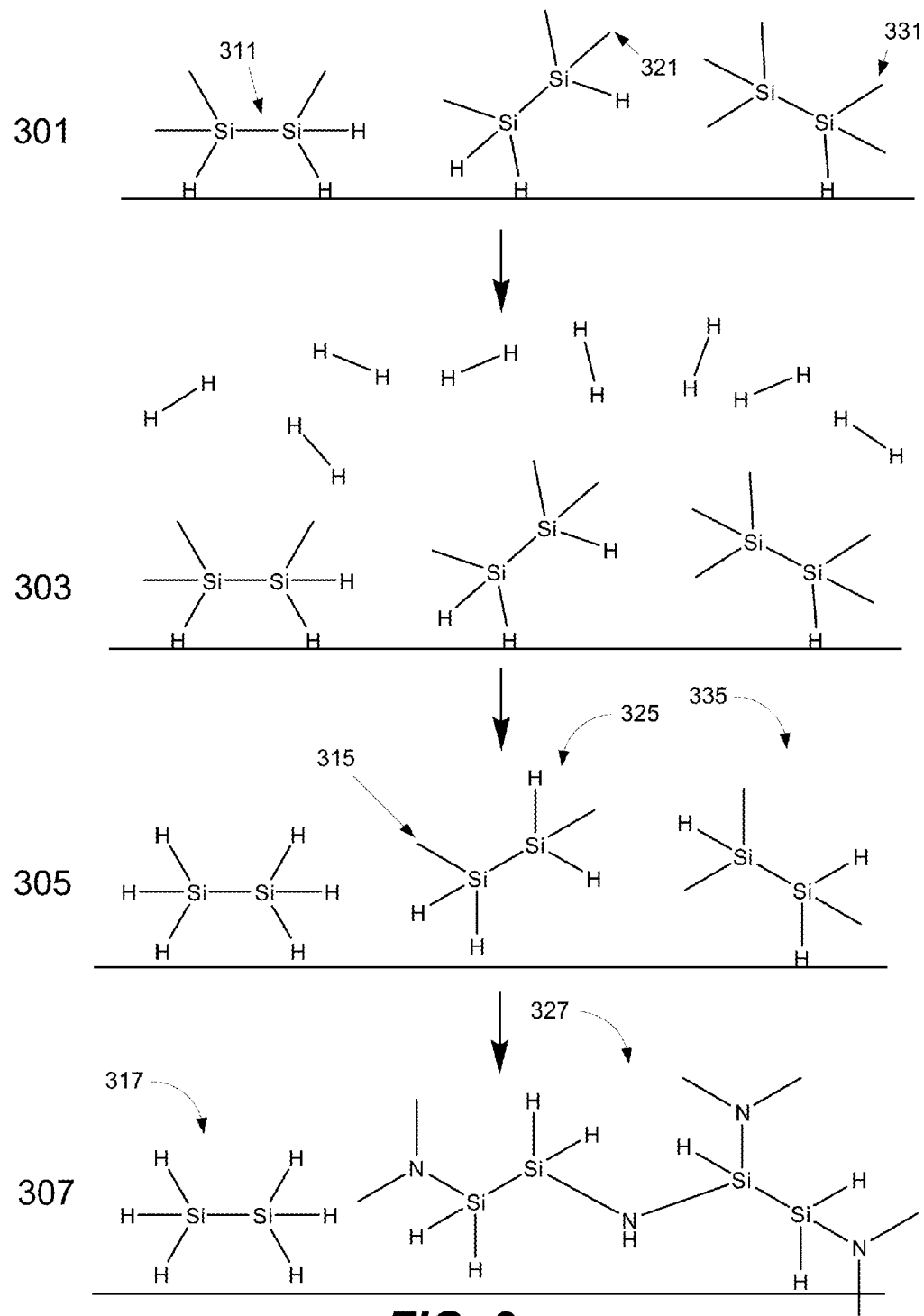
FIG. 3 is a schematic diagram of an example of a mechanism for inhibiting deposition in accordance with disclosed embodiments.

In some embodiments, the silicon-containing precursor adsorbs onto the substrate surface in a self-limiting manner such that once active sites are occupied by the silicon-containing precursor, little or no additional silicon-containing precursor will be adsorbed on the substrate surface. In various embodiments, operation 103 is performed such that not all active sites are occupied by a silicon-containing precursor. For example, silicon-containing precursors may be adsorbed onto about 60% of the substrate surface. In various embodiments, when the silicon-containing precursor is flowed to the station, the silicon-containing precursor adsorbs onto active sites on the surface of the substrate, forming a thin layer of the silicon-containing precursor on the surface. In some embodiments, a monolayer is of the silicon-containing precursor is formed. In some embodiments, the layer may be less than a monolayer, for example having a thickness between about 0.2 Å and about 0.4 Å. The substrate may be exposed to the silicon-containing precursor for a time between about 0.2 seconds and about 6 seconds, depending on the flow rate and the substrate surface area. It will be understood that that other exposure times may be used depending on the particular hardware and process parameters used. FIG. 3 is a schematic representation of an example of a highly reactive adsorbed layer on the surface of a substrate. In this example, the surface depicted is the top of the substrate between the openings of two features. In 301, disilane is provided as an example of a silicon-containing precursor that adsorbed onto the surface of the substrate. Without being bound by a particular theory, it is believed that the adsorbed layer of the silicon-containing precursor may include highly reactive species such dangling bonds (321, 331) and/or silicon-silicon dimers (311), resulting in a highly reactive surface. A dangling bond is an unsatisfied valence on the silicon atom. Some of these dangling bonds may result from hydrogen being cleaved from a silicon atom in the silicon-containing precursor, thereby leaving a highly reactive dangling bond. In some embodiments, the adsorbed layer at or near the top of the features, such as the top about 10% of the features, may be more reactive than in the sidewalls and at the bottom of the features. These reactive surfaces may be susceptible to undergoing a radical mechanism, particularly with a hydrogen-containing compound.

Silicon-containing precursors suitable for processes described herein include at least one Si—H bond. The precursor may be selected depending on the layer to be deposited. For example, if a silicon nitride layer is to be deposited, a silicon-containing precursor such as disilane may be used, as described in concurrently filed U.S. patent application Ser. No. 14/552,245, filed on Nov. 24, 2014, titled, "METHOD OF DEPOSITING AMMONIA FREE AND CHLORINE FREE CONFORMAL SILICON NITRIDE FILM," which is incorporated by reference herein.

An general silicon-containing precursor used in methods described herein may have the structure:

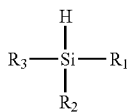

where $R_1$, $R_2$, and $R_3$ may be the same or different substituents, and may include silanes, amines, halides, hydrogen, or organic groups, such as alkylamines, alkoxy, alkyl, alkenyl, alkynyl, and aromatic groups.

Example silicon-containing precursors include polysilanes ($H_3Si$—$(SiH_2)_n$—$SiH_3$), where n≥1, such as silane, disilane, trisilane, tetrasilane; and trisilylamine:

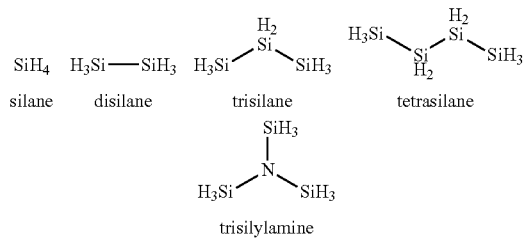

In some embodiments, the silicon-containing precursor is an alkoxysilane. Alkoxysilanes that may be used include, but are not limited to, the following:

$H_x$—Si—$(OR)_y$ where x=1-3, x+y=4 and R is a substituted or unsubstituted alkyl group; and $H_x(RO)_y$—Si—Si—$(OR)_yH_x$ where x=1-2, x+y=3 and R is a substituted or unsubstituted alkyl group.

Examples of silicon-containing precursors include: methylsilane; trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyl-diethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

In some embodiments, the silicon-containing precursor may be an aminosilane, with hydrogen atoms, such as bisdiethylaminosilane, diisopropylaminosilane, bis(tert-butylamino) silane (BTBAS), or tris(dimethylamino)silane. Aminosilane precursors include, but are not limited to, the following: $H_x$—Si—$(NR)_y$ where x=1-3, x+y=4 and R is an organic or hydride group.

In some embodiments, a halogen-containing silane may be used such that the silane includes at least one hydrogen atom. Such a silane may have a chemical formula of $SiX_aH_y$ where y≥1. For example, dichlorosilane ($H_2SiCl_2$) may be used, but silicon tetrachloride ($SiCl_4$) may not be suitable for disclosed embodiments.

Returning to FIG. 1, in operation 105, the process station is optionally purged to remove excess silicon-containing precursor in gas phase that did not adsorb onto the surface of the substrate. Purging may involve a sweep gas, which may be a carrier gas used in other operations or a different gas. In some embodiments, purging may involve evacuating the station. Operation 105 of FIG. 1 may correspond with purge phase 240A of FIG. 2, where the silicon-containing precursor flow is turned off, no plasma is ignited, and no second reactant is supplied to the station. The carrier gas, such as argon, continues to flow to purge any excess silicon-containing precursor from the station. In some embodiments, purge phase 240A may include one or more evacuation subphases for evacuating the process station. Alternatively, it will be appreciated that purge phase 240A may be omitted in some embodiments. Purge phase 240A may have any suitable duration, such as between about 0 seconds and about 60 seconds. In some embodiments, increasing a flow rate of a one or more sweep gases may decrease the duration of purge phase 240A. For example, a purge gas flow rate may be adjusted according to various reactant thermodynamic characteristics and/or geometric characteristics of the process station and/or process station plumbing for modifying the duration of purge phase 240A. In one non-limiting example, the duration of a sweep phase may be adjusted by modulating sweep gas flow rate. This may reduce deposition cycle time, which may improve substrate throughput. After a purge, the silicon-containing precursor molecules remain adsorbed onto the substrate surface.

Returning to FIG. 1, in operation 106, the substrate is exposed to a hydrogen-containing inhibitor, which may be a hydrogen-containing gas. The deposition may be inhibited thermally or, as described below, in some embodiments, a plasma may be used. Note that the hydrogen-containing inhibitor may not be flowed in every cycle. The hydrogen-containing gas may be ammonia ($NH_3$), hydrogen ($H_2$), or another hydrogen-containing gas. In some embodiments a mixture of two or more hydrogen-containing gases are used. The hydrogen-containing inhibitor may be flowed to the station for a time between about 0.05 seconds and about 60 seconds in some embodiments. Substrate exposure time to the hydrogen-containing inhibitor, flow rate of the hydrogen-containing inhibitor, and partial pressure of the hydrogen-containing inhibitor may depend on the type of substrate, type of features, and type of inhibitor used. The exposure time and flow rate of the inhibitor are modulated to selectively inhibit the surface at or near the top of the features. A longer exposure time may cause inhibition on more than just the top of the features for a deposition process where, if deposited without an inhibition process, deposited film at the top of the features is thicker than on the sidewalls or on the bottom of the features. Exposure time and flow rate changes may be made in accordance with a desired deposition profile. Deposition in some cases may be non-conformal such that there are more reactive sites at the top of the feature. In such cases, it may not be necessary to tightly control the inhibition process conditions.

In some implementations, modulating inhibition conformality can include operating or not operating in a mass transport limited regime. In a mass transport limited regime, the treatment rate inside the feature is limited by amounts of inhibitor that diffuse into the feature. Mass transport limiting process conditions may be achieved by supplying limited amounts of inhibitor into the processing chamber (e.g., use low treatment flow rates relative to the cavity profile and dimensions), while maintaining relative high treatment rates in order to consume some inhibitor as it diffuses into the feature. In certain embodiment, a concentration gradient is substantial, which may be caused from relatively high inhibition treatment kinetics and relative low treatment supply.

In some embodiments, a plasma is optionally ignited in operation 106. In some embodiments, the hydrogen-containing inhibitor may be flowed to the process station housing the substrate prior to igniting the plasma such that the inhibitor flow may stabilize. In some embodiments, the plasma is ignited for the same or substantially the same duration as the hydrogen-containing inhibitor flow. In various embodiments, the plasma is a radio frequency (RF) plasma, which may have a frequency of at least about 13.56 MHz. The plasma may be an in-situ plasma. In some embodiments, a remote plasma may be used. The power of the plasma may depend on the type of substrate, types of features, and type of inhibitor used. Generally, a higher power plasma allows the inhibitor to flow deeper into features—which in turn inhibits surfaces deeper on the sidewalls in the features. Thus, the plasma power used may depend on the feature depth and pattern (e.g., trenches, wide features, narrow features, etc.). In some embodiments, the plasma is ignited in only some of the cycles where the hydrogen-containing inhibitor is flowed.

For deposition of silicon oxide, a hydrogen-containing plasma is used to inhibit deposition. Example hydrogen-containing plasmas include hydrogen plasma and ammonia plasma. For example, if a silicon oxide film is being deposited and the surface of the substrate includes Si—OH terminated surface after reacting with oxygen in an ALD cycle, plasma may be used with a hydrogen-containing inhibitor in a subsequent cycle to inhibit deposition. In some embodiments, the hydrogen-containing plasma may be used to form a Si—H terminated surface. To improve deposition, the Si—OH terminated surface may be exposed to a nitrogen plasma to form an Si—NH$_2$ terminated surface, which may be easier to nucleate than an Si—OH terminated surface. In a subsequent ALD cycle, —NH$_2$ groups are removed and re-converted to —OH groups when an oxidizing plasma is used to form silicon oxide.

The inhibition methods described herein are appropriate for silicon-containing films deposited using a radical mechanism rather than an acid-base mechanism. That is, a silicon-containing precursor adsorbed on the surface of the substrate may form silicon-silicon dimers and/or silicon dangling bonds, thereby forming reactive sites prepared to react with a second reactant in subsequent processing to form a silicon-containing film. Radical mechanisms are distinguished from acid-base mechanisms. In acid-base processes for depositing a silicon-containing film on a substrate, the silicon-containing precursor adsorbed on the surface of the substrate may be terminated with atoms or groups that may act as an acid or that accept an electron from a second reactant that acts as a base and donates an electron in the reaction. For example, in an acid-base reaction, tetrachlorosilane may adsorb onto a surface of the substrate, leaving a chlorine terminated surface that reacts with, for example, ammonia as a reactant gas, which donates an electron to form silicon nitride. In contrast, in a radical mechanism, silicon-silicon dimers or silicon dangling bonds on the surface may be more susceptible to binding to hydrogen from an ammonia reactant rather than forming an amine terminated surface. Silicon-containing precursors including a Si—H bond may undergo a radical mechanism, while a precursor that does not have a Si—H bond may undergo an acid-base reaction. Example compounds that do not have an Si—H bond and therefore may not be used in accordance with disclosed embodiments include Si(N(CH$_3$)$_2$)$_4$ and SiCl$_4$.

As shown in FIG. 3, in 303, the dangling bonds of the adsorbed layer are exposed to a hydrogen-containing inhibitor. In the example provided in FIG. 3, the hydrogen-containing inhibitor is hydrogen gas. Note that in contrast to an acid-base mechanism where hydrogen gas is an inert and/or carrier gas, hydrogen gas in disclosed embodiments is used as an inhibitor. In 305, the hydrogen gas bonds with the dangling bonds on the surface of the substrate, thereby terminating the bonds on the adsorbed layer. Note that as shown in 305, not all dangling bonds 315 react with the hydrogen. The hydrogen gas does not form a film on the surface—rather, in some embodiments, the hydrogen atoms may terminate the surface.

Without being bound by a particular theory, it is believed that the hydrogen-containing gas may retard or mitigate deposition on the substrate surface at or near the top of the features, such as at the opening of a feature. The short duration of the exposure ensures that only the top of the features are impacted by the inhibition exposure. In some embodiments, a purge phase, such as one described above with respect to operation 105, may be performed after the hydrogen-containing inhibitor flow is stopped.

In operation 107 of FIG. 1, the substrate is exposed to a second reactant, such as a reactant gas. The second reactant gas may be nitrogen, a nitrogen-containing gas, oxygen, an oxygen-containing gas, or another reactive gas. For example, if the silicon-containing film to be deposited is silicon nitride, the second reactant gas may be nitrogen (N$_2$), or a nitrogen-containing gas. If the silicon-containing film to be deposited is silicon oxide, the second reactant gas may be oxygen (O$_2$) and nitrogen dioxide (NO$_2$). In various embodiments, operation 107 may be performed thermally or with plasma activation.

In some embodiments, operation 107 optionally includes igniting a plasma to form a second reactant plasma. For example, in some embodiments, a plasma is not used when the second reactant is introduced to a processing reactor, such as in thermal ALD processes. In the example provided in FIG. 2, a plasma may be turned on with the second reactant flow such as in an PEALD process during the second reactant plasma exposure phase in 260A and 260B for the deposition cycles 210A and 210B respectively. In some embodiments, the second reactant flow may be turned on prior to turning on the plasma, for example, to allow the second reactant flow to stabilize. Note that second reactant flow is turned off during the plasma exposure phases and argon as a carrier gas continues to flow. The substrate may be exposed to the second reactant plasma for a duration between about 0.1 second and about 6 seconds. In some embodiments, second reactant plasma exposure phase 260A or 260B may have a duration that exceeds a time for plasma to interact with all precursors adsorbed on the substrate surface, forming a continuous film atop the substrate surface. It is understood that these parameters may be modified depending on the particular hardware and processing conditions used.

In various embodiments, the plasma is an in-situ plasma, such that the plasma is formed directly above the substrate surface in the station. Example power per substrate areas for an in-situ plasma are between about 0.2122 W/cm$^2$ and about 2.122 W/cm$^2$ in some embodiments. For example, the power may range from about 600 W to about 6000 W for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that second reactant is ignited in a remote plasma generator upstream of the station, then delivered to the station where the substrate is housed.

As shown in FIG. 3, in 307, the molecule 317 is inhibited from forming silicon-nitride bonds because hydrogen has terminated the silicon dangling bonds in 305. Note that the molecules 325 and 335 have formed silicon nitride bonds between the two structures as well as branching from the silicon centers to form molecule 327. This depicts one example of inhibiting silicon nitride formation by exposing silicon dangling bonds to a hydrogen inhibitor.

Returning to FIG. 1, in operation 109, the process station is purged. As shown in FIG. 2, operation 109 may correspond with purge phase 280A, where the silicon-containing precursor flow is turned off, no plasma is ignited, and no second reactant is supplied to the station. The purge may be performed by flowing the carrier gas, which may be any of those described above with respect to operation 105. In many embodiments, the carrier gas used in operation 105 and 109 are the same gas, and in some embodiments, the carrier gas is continuously flowed during these operations, such as shown in FIG. 2.

Performing operations 103-109 of FIG. 1 may constitute a cycle, such as deposition cycle 210A, or deposition cycle 210B in FIG. 2. Depending on the exposure time of the operations, each cycle may deposit a silicon-containing film of varying thickness. Thus, the duration of some processes may be longer when depositing films more than a few nanometers thick. Some reactants may have long exposure times to deposit a conformal film, which may also reduce wafer throughput time.

In operation 113, it is determined whether the film has been deposited to an adequate thickness. If not, operations 103-109 may be repeated until a film of adequate thickness is deposited. Any suitable number of deposition cycles may be included in an ALD process to deposit a desired film thickness of a silicon-containing film. The timing sequence in FIG. 2 depicts examples of various operations of FIG. 1 in two deposition cycles, 210A and 210B. As shown, each cycle includes a silicon-containing precursor exposure phase 220A, or 220B, whereby the substrate is exposed to a silicon-containing precursor as described above with respect to operation 103 of FIG. 1. Following a silicon-containing precursor exposure phase 220A, a purge phase 240A is performed as describe above with respect to operation 105 of FIG. 1. The inhibitor phase 250A may be performed such that a hydrogen-containing inhibitor as described with respect to operation 106 of FIG. 1 is delivered to the station. The inhibitor phase 250A may not be performed in every deposition cycle. The example deposition cycles 210A and 210B as shown in FIG. 2 show an embodiment where the inhibitor phase is performed in both cycles. Following the inhibitor phase 250A, the second reactant with plasma exposure phase 260A is shown. Note that the plasma is turned on in the depicted example in FIG. 2, but in some embodiments, the plasma may not be turned on during 260A or 260B. The second reactant is flowed during these phases, while the silicon-containing precursor and inhibitor are turned off. Following the second reactant with plasma exposure phase 260A, a purge phase is optionally performed in 280A, such that only a purge gas, such as argon as depicted in FIG. 2, is flowed. In the example depicted in FIG. 2, it is determined in operation 113 of FIG. 1 that the desired thickness is not yet achieved, and therefore, another cycle of operations 103-109 is performed (accordingly, silicon-containing precursor exposure phase 220B, followed by purge phase 240B, inhibitor phase 250B, second reactant with plasma exposure phase 260B, and purge phase 280B).

Subsequent deposition cycles may be performed, such that the deposition rate of the silicon-containing thin film on the surface of the substrate near the openings of the features is less than the deposition rate on the other surfaces of the feature. Note that although the Figure shows inhibitor exposure in both cycles, in some embodiments, the inhibition exposure may be performed in every other cycle, or every 5 to 10 cycles.

In many of the above-described embodiments an adsorbed layer of a precursor is exposed to an inhibitor. In alternative embodiments, a substrate may be exposed an inhibitor before being exposed to a precursor. Such embodiments can also improve step coverage in high aspect ratio features or features that cut through multiple, dissimilar materials. In some embodiments, an inhibitor may be appropriately selected to overcome high aspect ratio challenges or deposition on dissimilar materials.

In some embodiments, the methods may be employed in depositions that use metal organic precursors. As feature sizes decrease and as candidate metal organic precursors of interest become employed more with substantial, physically large ligands that are byproducts of the deposition reaction, compensation for transport phenomena both of a precursor into the features as well as byproducts out of the features becomes important. An example method for exposing to an inhibitor prior to introducing a precursor for depositing a film may be performed by the sequence described in the following paragraphs.

In some embodiments, prior to exposing the substrate to film deposition precursors, the substrate may be exposed to an inhibitor chemical that selectively adsorbs to available sites on the substrate and inside its features subject to a transport limited phenomena such that more sites are occupied at the tops of features while fewer (or none) are occupied at the bottoms. Subsequently, the inhibitor chemical ambient may be removed by purging or evacuation.

If the inhibitor chemical reacts with the substrate, then the substrate may be exposed to a precursor chemical that selectively adsorbs to the remaining substrate sites at the feature bottoms. Selective adsorption may result in more adsorption at the feature bottoms than on the feature sidewalls.

If the inhibitor chemical does not react with the substrate, the substrate may be optionally exposed to another chemical that reacts with the inhibitor and then the reactant ambient may be subsequently removed. The substrate then may be exposed to a precursor chemical that selectively adsorbs to the remaining substrate sites at the feature bottoms with more adsorption at the feature bottoms than on the sidewalls.

In some embodiments, after the precursor adsorbs onto substrate sites in the feature, the precursor ambient may be removed by purging or evacuation. In some embodiments, the substrate may be exposed to a reactant chemistry that may or may not include plasma exposure that consumes a portion of the inhibitor, such as towards the feature bottoms. Alternatively, the inhibitor may be chosen such that rather than consuming it, it is converted to a useful, reacted film. After the substrate is exposed to the reactant, the reactant ambient may then be removed by purging or evacuation. In some embodiments, operations performed after the inhibitor chemical reacts with the substrate may be repeated until all of the inhibitor is consumed or converted. In some embodiments, the above operations involving inhibition and deposition may be repeated until a desired thickness of film is deposited.

In some embodiments, a method may involve exposing a substrate to an inhibitor prior to exposure to a precursor (e.g., prior to exposure to a silicon-containing precursor) as well as exposing an adsorbed layer of the precursor to an inhibitor as described above with respect to FIG. 1. The same or different inhibitors may be used in these operations.

Apparatus

Figure 4:
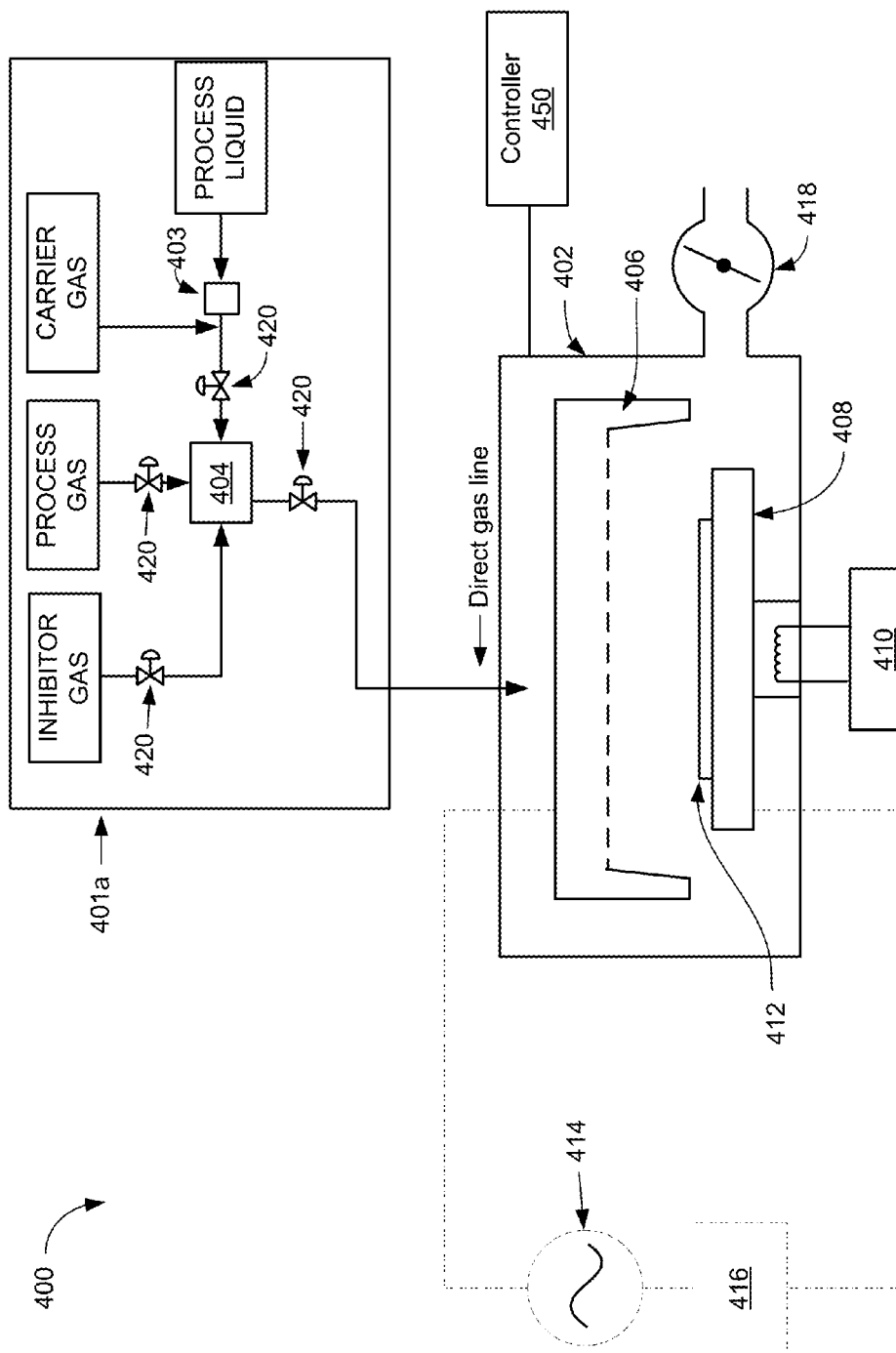
FIG. 4 is a schematic diagram of an example process station for performing disclosed embodiments.

FIG. 4 depicts a schematic illustration of an embodiment of an atomic layer deposition (ALD) process station 400 having a process chamber body 402 for maintaining a low-pressure environment. A plurality of ALD process stations 400 may be included in a common low pressure process tool environment. For example, FIG. 4 depicts an embodiment of a multi-station processing tool 400. In some embodiments, one or more hardware parameters of ALD process station 400, including those discussed in detail below, may be adjusted programmatically by one or more computer controllers 450.

ALD process station 400 fluidly communicates with reactant delivery system 401a for delivering process gases to a distribution showerhead 406. Reactant delivery system 401a includes a mixing vessel 404 for blending and/or conditioning process gases for delivery to showerhead 406. In some embodiments, the inhibitor gas may be introduced to the mixing vessel prior to introduction to the chamber body 402, such as if provided with a carrier gas. In some embodiments, the inhibitor gas may be directly delivered to the chamber body 402. One or more mixing vessel inlet valves 420 may control introduction of process gases to mixing vessel 404. These valves may be controlled depending on whether a process gas, inhibitor gas, or carrier gas may be turned on during various operations. In some embodiments, the inhibitor gas may be generated by using an inhibitor liquid and vaporizing using a heated vaporizer.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant, such as a silicon-containing precursor, may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) (not shown) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes gases toward substrate 412. For example, showerhead 406 may distribute a silicon-containing precursor gas to the substrate 412, or a purge or carrier gas to the chamber body 402, or an inhibitor gas to the substrate 412, or a second reactant to the substrate 412 in various operations. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, a microvolume is located beneath showerhead 406. Practicing disclosed embodiments in a microvolume rather than in the entire volume of a process station may reduce reactant exposure and purge times, may reduce times for altering process conditions (e.g., pressure, temperature, etc.) may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 408 may be raised or lowered to expose substrate 412 to microvolume 407 and/or to vary a volume of microvolume 407. For example, in a substrate transfer phase, pedestal 408 may be raised to position substrate 412 within microvolume 407. In some embodiments, microvolume 407 may completely enclose substrate 412 as well as a portion of pedestal 408 to create a region of high flow impedance.

Optionally, pedestal 408 may be lowered and/or raised during portions the process to modulate process pressure, reactant concentration, etc., within microvolume 407. In one scenario where process chamber body 402 remains at a base pressure during the process, lowering pedestal 408 may allow microvolume 407 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 450.

In another scenario, adjusting a height of pedestal 408 may allow a plasma density to be varied during optional plasma activation processes. For example, the plasma may be activated when the inhibitor gas is introduced to the chamber body 402, or when the second reactant is flowed to the chamber body 402. In some embodiments, a plasma may not be activated during flow of the inhibitor gas or the flow of the second reactant. At the conclusion of the process phase, pedestal 408 may be lowered during another substrate transfer phase to allow removal of substrate 412 from pedestal 408.

While the example microvolume variations described herein refer to a height-adjustable pedestal 408, it will be appreciated that, in some embodiments, a position of showerhead 406 may be adjusted relative to pedestal 408 to vary a volume of microvolume 407. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, gas concentrations and partial pressures of gases or gas flow rates, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as disilane), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert, inhibitor and/or reactant gas which may be the same as or different from the gas used in the first recipe phase (e.g., a hydrogen-containing inhibitor), instructions for modulating a flow rate of a carrier gas, and time delay instructions for the third recipe phase. A fourth recipe phase may include instructions for modulating or stopping a flow rate of an inert and/or a reactant gas (e.g., a second reactant such as nitrogen or a nitrogen-containing or oxygen-containing gas), instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 408 may be temperature controlled via heater 410. Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

Figure 5:
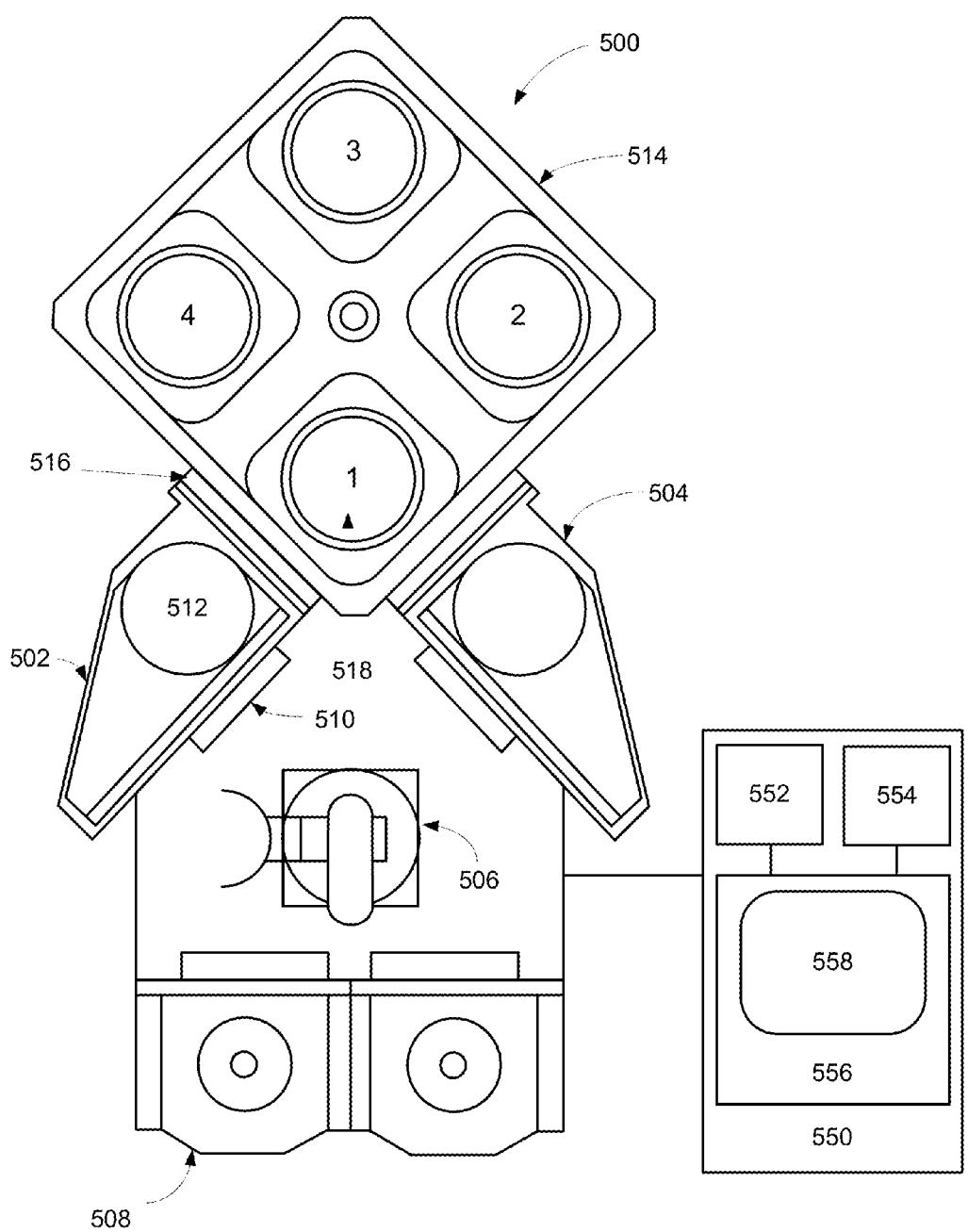
FIG. 5 is a schematic diagram of an example process tool for performing disclosed embodiments.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., TMA, ammonia, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases and/or inhibitor gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted to evaluate the effect of periodically exposing a substrate to a hydrogen-containing plasma. A semiconductor substrate having features with an aspect ratio of 4:1 and feature openings of 20 nm was exposed to 120 cycles of disilane and nitrogen plasma to deposit a silicon nitride film.

The conditions for this substrate are summarized in Table 1 below.

TABLE 1

Conditions for Silicon Nitride Film Deposition without Inhibition

| Step | Time (sec) | Flow Rate (slm) | | | Power |
| --- | --- | --- | --- | --- | --- |
| | | Disilane | $N_2$ | Ar | HFRF |
| Dose | 3 | 0.25 | 2 | | |
| Dose Purge | 3 | | 4.5 | | |
| Preflow | 1 | | 1 | 1 | |
| RF ON | 2.5 | | 0.5 | | 300 W |
| RF Purge | 0.1 | | 4.5 | | |

To compare, another substrate having features with an aspect ratio of 4:1 and feature openings of 20 nm was exposed to 120 cycles of disilane (as the silicon-containing precursor) and nitrogen plasma (as the second reactant) while also periodically exposed to ammonia plasma (as a hydrogen-containing inhibitor) for 5 seconds in each cycle prior to exposing to nitrogen plasma. The chamber was purge after each exposure to disilane and nitrogen plasma. The ammonia plasma was ignited in situ. The chamber pressure for both substrates was 2 Torr at the top of the chamber and 3.5 Torr at the bottom, with argon as a carrier gas and nitrogen as a purge gas. During the dose purge with nitrogen gas, some silicon nitride was formed.

The conditions for the second substrate are summarized in Table 2 below.

TABLE 2

Conditions for Silicon Nitride Film Deposition with Inhibition

| Step | Time (sec) | Flow Rate (slm) | | | | Power |
| --- | --- | --- | --- | --- | --- | --- |
| | | Disilane | $N_2$ | Ar | $NH_3$ | HFRF |
| Dose | 3 | 0.25 | 2 | | | |
| Dose Purge | 3 | | 4.5 | | | |
| $NH_3$ Preflow | 1 | | | | 1 | |
| $NH_3$ Treat | 5 | | | | | 600 W |
| Preflow | 1 | | 1 | 1 | | |
| RF ON | 2.5 | | 0.5 | | | 300 W |
| RF Purge | 0.1 | | 4.5 | | | |

The conformality of the substrate without periodic ammonia exposure was about 55%, and the substrate with periodic ammonia exposure was about 85%. FIGS. 6A and 6B depict images of the openings of features with silicon nitride deposited without periodic inhibitor exposure (6A) versus with periodic inhibitor plasma exposure (6B). The substrate without periodic ammonia exposure had about 140 Å of silicon nitride deposited on the substrate between the openings of two features (601), while the substrate with periodic ammonia exposure had about 54 Å of silicon nitride deposited on the substrate in the same area. Note that surfaces of the features near the top of the features at 601 were selectively inhibited in FIG. 6B, and not on the sidewalls at 603.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing semiconductor substrates, the method comprising:
    exposing a substrate comprising a feature to a silicon-containing precursor to form an adsorbed layer; and
    exposing the adsorbed layer to a hydrogen-containing inhibitor to selectively inhibit deposition of a silicon-containing film on the substrate,
    wherein the silicon-containing precursor comprises at least one Si—H bond.

2. The method of claim 1, wherein deposition is selectively inhibited at a top about 10% of the feature.

3. The method of claim 1, wherein the hydrogen-containing inhibitor is selected from the group consisting of ammonia, hydrogen, and combinations thereof.

4. The method of claim 1, further comprising, after exposing the adsorbed layer to the hydrogen-containing inhibitor, exposing the substrate to a second reactant to form the silicon-containing film.

5. The method of claim 4, wherein the second reactant is selected from the group consisting of nitrogen, nitrogen-containing gases, and oxygen-containing gases.

6. The method of claim 4, wherein exposing the substrate to the second reactant further comprises igniting a plasma.

7. The method of claim 1, wherein exposing the adsorbed layer to the hydrogen-containing inhibitor further comprises igniting an in-situ plasma.

8. The method of claim 7, wherein the silicon-containing film comprises silicon oxide.

9. The method of claim 7, further comprising, after exposing the adsorbed layer to the hydrogen-containing inhibitor, exposing the substrate to a second reactant to form the silicon-containing film, wherein the second reactant is an oxygen-containing reactant.

10. The method of claim 1, wherein the adsorbed layer comprises dangling bonds, silicon-silicon dimers, and combinations thereof.

11. The method of claim 1, further comprising purging a reaction chamber housing the substrate after exposing the substrate to the silicon-containing precursor.

12. The method of claim 1, wherein the silicon-containing film comprises silicon nitride.

13. The method of claim 1, wherein the silicon-containing film comprises crystalline silicon, amorphous silicon, or polysilicon.

14. The method of claim 1, further comprising, prior to exposing the substrate to the silicon-containing precursor, exposing the substrate to an inhibitor.

* * * * *